United States Patent
Wei et al.

(10) Patent No.: US 6,924,160 B2
(45) Date of Patent: Aug. 2, 2005

(54) MANUFACTURING METHOD OF ORGANIC FLAT LIGHT-EMITTING DEVICES

(75) Inventors: Mao-Kuo Wei, Hsinchu (TW); Jih-Yi Wang, Hsinchu (TW)

(73) Assignee: RiTdisplay Corporation, Hsinchu (TW)

( * ) Notice: Subject to any disclaimer, the term of this patent is extended or adjusted under 35 U.S.C. 154(b) by 120 days.

(21) Appl. No.: 10/310,056

(22) Filed: Dec. 5, 2002

(65) Prior Publication Data

US 2003/0124752 A1 Jul. 3, 2003

(30) Foreign Application Priority Data

Dec. 31, 2001 (TW) .......................................... 90133401 A

(51) Int. Cl.⁷ .............................................. H01L 21/64
(52) U.S. Cl. ......................................................... 438/29
(58) Field of Search .............................. 438/22, 27, 29, 438/30, 31, 32, 34, 35, 99; 257/40, 79, 88, 91, 95, 98; 428/698; 313/504–509, 113

(56) References Cited

U.S. PATENT DOCUMENTS

| | | | | |
|---|---|---|---|---|
| 5,715,022 A | * | 2/1998 | Takamatsu et al. | ......... 348/759 |
| 5,745,199 A | * | 4/1998 | Suzuki et al. | ................. 349/95 |
| 5,779,924 A | * | 7/1998 | Krames et al. | ............... 216/24 |
| 5,936,347 A | | 8/1999 | Isaka et al. | |
| 6,080,030 A | | 6/2000 | Isaka et al. | |
| 6,114,805 A | * | 9/2000 | Codama et al. | ............. 315/509 |
| 6,420,735 B2 | * | 7/2002 | Kim | ............................. 257/95 |
| 6,559,593 B1 | * | 5/2003 | Heeks et al. | ................. 313/506 |
| 6,586,876 B2 | * | 7/2003 | Tsai et al. | .................... 313/509 |
| 6,661,445 B2 | * | 12/2003 | Mashimo et al. | ........... 347/238 |
| 2001/0033135 A1 | * | 10/2001 | Duggal et al. | .............. 313/506 |
| 2002/0022156 A1 | * | 2/2002 | Bright | ........................ 428/698 |
| 2002/0057054 A1 | * | 5/2002 | Chung et al. | ............... 313/506 |
| 2003/0020399 A1 | * | 1/2003 | Moller et al. | ............... 313/504 |
| 2003/0052616 A1 | * | 3/2003 | Antoniadis et al. | ......... 315/169 |

* cited by examiner

Primary Examiner—Erik Kielin
Assistant Examiner—Jennifer M Dolan
(74) Attorney, Agent, or Firm—Birch, Stewart, Kolasch & Birch, LLP

(57) ABSTRACT

A manufacturing method of organic flat light-emitting devices includes the following steps. First, a transparent substrate is provided, which has several microstructures on its first surface and the microstructures have a maximum height of 100 μm from the first surface. Second, a transparent anode is formed on the second surface of the transparent substrate that is opposite to the first surface. Thirdly, at least one organic electro-luminescent layer is formed on the transparent anode. Finally, a metal cathode is formed on the organic electro-luminescent layer. Another manufacturing method of organic flat light-emitting devices includes the steps of: forming a transparent thin film on a first surface of a transparent substrate, the transparent thin film having a plurality of microstructures with a maximum height of 100 μm; forming a transparent anode on a second surface of the transparent substrate opposite to the first surface; forming at least one organic electro-luminescent layer; and forming a metal cathode on the organic electro-luminescent layer.

2 Claims, 6 Drawing Sheets

MANUFACTURING METHOD OF ORGANIC FLAT LIGHT-EMITTING DEVICES

BACKGROUND OF THE INVENTION

1. Field of Invention

The invention relates to a manufacturing method of organic flat light-emitting devices and, in particular, to a manufacturing method of organic flat light-emitting devices that use microstructures in their manufacture.

2. Related Art

In organic flat light-emitting devices, the refraction index of the organic electro-luminescent layer $n_1$ (1.7) is very close to that of the transparent anode $n_2$ (1.8–2.0), and the refraction index of the transparent substrate $n_3$ (1.4–1.5) is smaller than $n_1$ but larger than that of air (1). According to Snell's Law, when a beam of light goes through an interface, the product of the refraction index and the sine of the incident angle in the incident medium are equal to that in the refractive medium. When a beam of light goes from the transparent anode into the transparent substrate and the incident angle is greater than $\sin^{-1}(n_3/n_2)$, total reflection occurs and the light is limited to propagation within the organic electro-luminescent layer and the transparent anode. This results in the transparent anode/organic electro-luminescent layer waveguide phenomenon. If the beam of light propagates out from the transparent substrate and the incident angle is greater than $\sin^{-1}(1/n_3)$, the light will be totally reflected. The light is restricted to propagate within the transparent substrate, resulting in the substrate waveguide phenomenon. However, when the incident angle is smaller than $\sin^{-1}(1/n_3)$, light will propagate out of the element. One thus sees that only part of the light generated by the organic flat light-emitting device that can propagate out of the element. The rest results in the substrate waveguide phenomenon inside the substrate. From actual measurements, one discovers that the light flux emitted from the organic flat light-emitting device is roughly 20% to 30% of that generated by the organic electro-luminescent layer.

The conventional manufacturing method of organic flat light-emitting devices often uses a substrate with a high refraction index and attaches convex lenses on the light-emitting surface to increase the external quantum efficiency. As shown in FIG. 1, convex lenses 31 with a diameter between 2 mm and 3 mm are attached on the light-emitting surface. If the material of the convex lenses 31 is the same as that of the transparent substrate 32, the light flux of the light-emitting element can be increased by 60% to 100%. If lenses with a higher refraction index are used, the light flux of the element can be increased by 200%. When making the light-emitting element 3, a refraction index matching oil is employed to attach the convex lenses 31 to the light-emitting surface. This is not suitable for long-term use. Another commonly used technique is that disclosed in the U.S. Pat. Nos. 5,936,347 and 6,080,030. The semi-convex lenses or semi-concave lenses are directly formed on a glass substrate by hot-embossing method, thereby increasing the external quantum efficiency of the element. However, the operation temperature for glass hot-embossing method is very high and is likely to make the glass locally deformed. Furthermore, the operation time (for increases and decreases in temperature) is too lengthy for use in mass production.

The elements made using the above-mentioned two manufacturing methods have the drawback of being too thick. It is not suitable for the trend of developing compact light-emitting devices. Moreover, the first conventional method uses a refraction index matching oil to attach the lenses on the light-emitting surface. Elements made in this method are not suitable for long-term use. The other method, however, can easily locally deform the glass substrate. The product yields in the prior art are thus not reliable for commercialization. Furthermore, the manufacturing process requires a longer time. It is therefore highly desirable to create a better method to improve the manufacturing process and product yield.

SUMMARY OF THE INVENTION

It is an objective of the invention to provide a manufacturing method for organic flat light-emitting devices to shorten the manufacturing time, to lower the manufacturing cost, to have a compact and light structure, and to have a better light-emitting efficiency.

To achieve the above objective, the disclosed manufacturing method includes the steps of: providing a transparent substrate, which has several microstructures on its first surface, each of the microstructures having a maximum height of 100 μm; forming a transparent anode on the second surface of the transparent substrate opposite to the first surface; forming at least one organic electro-luminescent layer on the transparent anode; and forming a metal cathode on the organic electro-luminescent layer.

The invention also provides another manufacturing method for organic flat light-emitting devices, which includes the steps of: providing a transparent substrate, which has several microstructures on its first surface, each of the microstructures having a curved surface; forming a transparent anode on the second surface of the transparent substrate opposite to the first surface; forming at least one organic electro-luminescent layer on the transparent anode; and forming a metal cathode on the organic electro-luminescent layer. The invention further provides a manufacturing method for organic flat light-emitting devices, including the steps of: providing a transparent substrate, which has a first surface and a second surface, wherein the first surface is formed with a plurality of microstructures; forming a transparent anode on a second surface of the transparent substrate opposite to the first surface; forming at least one organic electro-luminescent layer; and forming a metal cathode on the organic electro-luminescent layer.

According to the disclosed manufacturing method for organic flat light-emitting devices, the organic flat light-emitting device has several microstructures to increase the external quantum efficiency of the element. It can achieve the goals of saving energy and being environmentally friendly. In comparison with the prior art, the microstructures used in the invention can minimize the thickness of the substrate and the whole device. The manufacturing time can be shortened and the cost can be lowered.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

BRIEF DESCRIPTION OF THE DRAWINGS

The invention will become more fully understood from the detailed description given in the herein below illustration, and thus are not limitative of the present invention, and wherein.

DETAILED DESCRIPTION OF THE INVENTION

Figure 1:
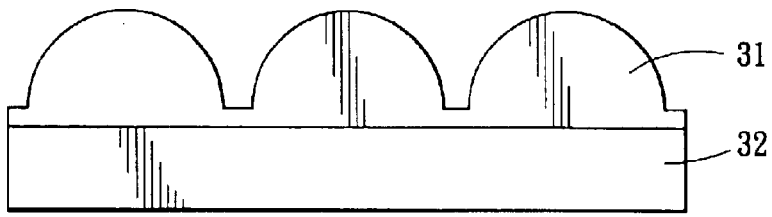
FIG. 1 is a schematic view of the conventional organic flat light-emitting device.
Figure 2:
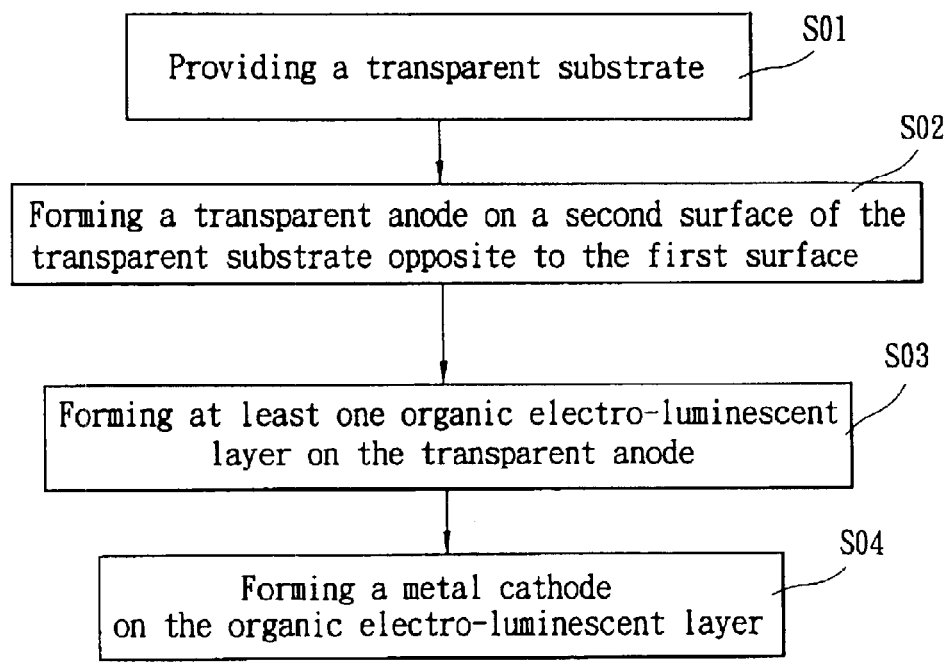
FIG. 2 is a schematic view of an embodiment of the disclosed manufacturing method for organic flat light-emitting devices.

As shown in FIG. 2, an embodiment of the manufacturing method for an organic flat light-emitting device includes the following steps: Providing a transparent substrate (S01), wherein a first surface of the transparent substrate has several microstructures, and the maximum distance from the top of each microstructure to the first surface is about 100 μm; forming a transparent anode on a second surface of the transparent substrate opposite to the first surface (S02); forming at least one organic electro-luminescent layer on the transparent anode (S03); and forming a metal cathode on the organic electro-luminescent layer.

Figure 3:
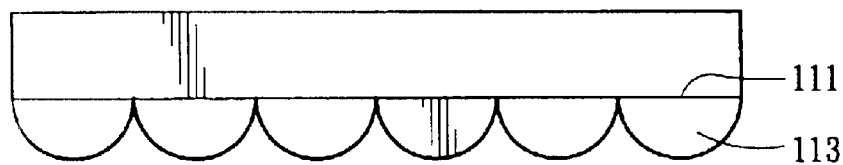
FIG. 3 is a schematic view of step S01 of the invention.

As shown in FIG. 3, the first surface 111 of the transparent substrate 11 has several microstructures 113. The transparent substrate 11 may be a plastic substrate or a flexible substrate. In this case, the plastic substrate or the flexible substrate may be a polycarbonate (PC) substrate, a polyester (PET) substrate, a cyclic olefin copolymer (COC) substrate, or a metallocene-based cyclic olefin copolymer (mCOC). The thickness of the transparent substrate 11 is between 0.2 mm and 5 mm.

Figure 4A:
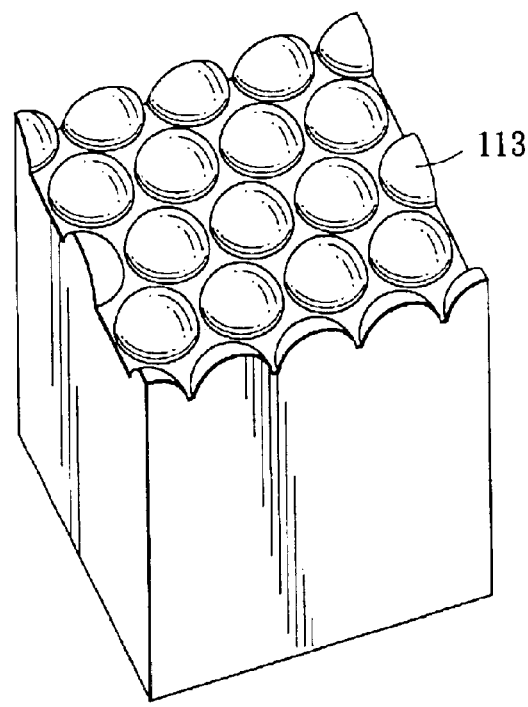
FIGS. 4A to 4C are schematic views of the microscopes of the invention.
Figure 4B:
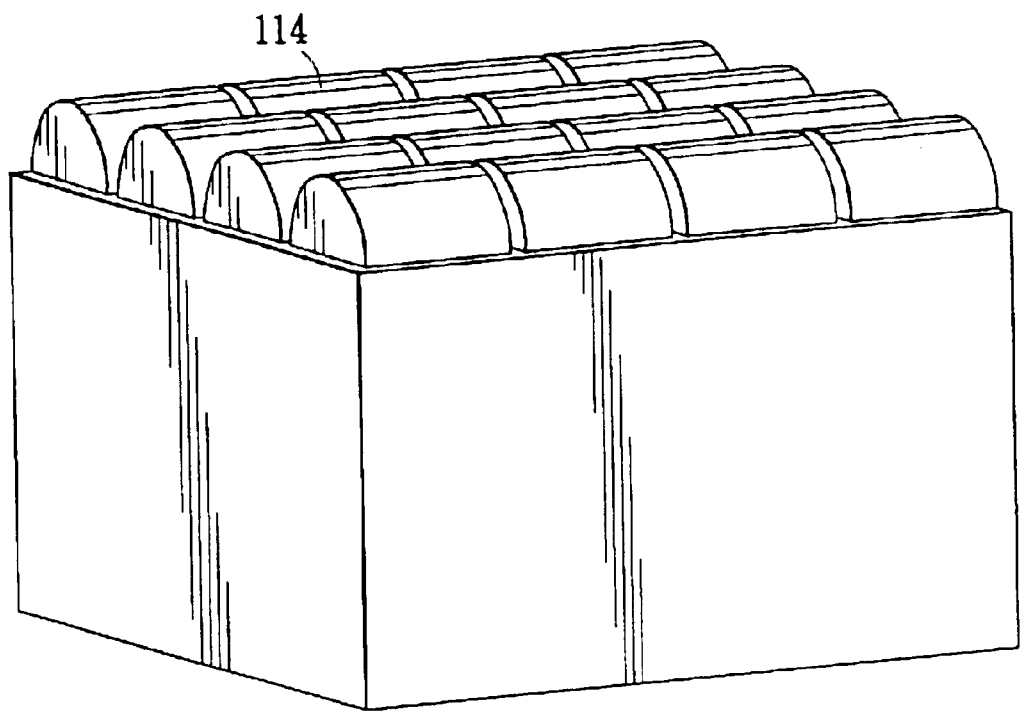
Figure 4C:
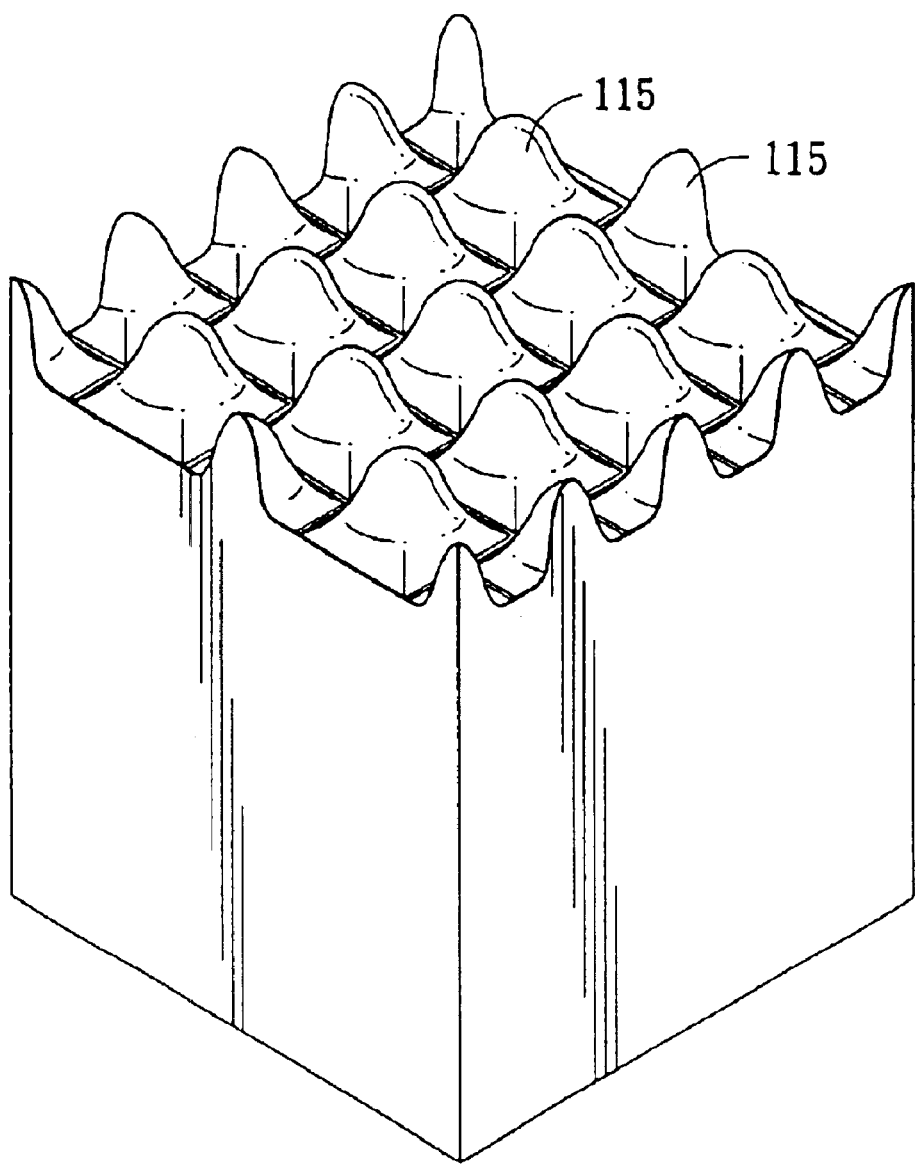

Each of the microstructures has a curved surface and has a maximal height of about 100 μm. In other words, the distance from the top of each microstructure 113 to the first surface 111 is between 5 μm and 100 μm. The curved surface may be similar to a spherical cap (as shown in FIG. 4A). The diameter of the base of the spherical cap is between 10 μm and 500 μm. Of course, the microstructures 113 can be similar to a cylindrical cap 114 (as shown in FIG. 4B). The cylindrical cap 114 has a diameter between 10 μm and 500 μm and a length between 10 μm and 500 μm. Moreover, the microstructures 113 may be a protruding curved surface with a right polygon border 115. An example with a square border is shown in FIG. 4C. The side length of the square border of the protruding curved surface 115 is between 10 μm and 500 μm.

In the current embodiment, the transparent substrate can be formed by injection molding method. Two molds (not shown) are used in the injection molding method. The surface of the first mold is an optics-graded smooth plane. The surface of the second mold has a microscopic structure. After being heated and melted, plastic particles are ejected between the two molds to make a transparent substrate 11 with the microstructures.

On the other hand, the transparent substrate 11 can be formed by hot-embossing method. This method requires an optics-graded platform (now shown). The transparent substrate is placed on to the platform and heated to a work temperature. The hot embossing mold is placed on the transparent plastic substrate and imposed by a homogeneous pressure. The hot embossing mold has a microscopic structure to form a transparent substrate 11 with microstructures.

The microstructures 113 in the embodiment are used to enhance the external quantum efficiency of the organic flat light-emitting device of the present invention. In the light-emitting device, the refraction index of the transparent substrate 11 $n_{sub}$ is greater than that of air. Therefore, when the incident angle of a beam of light produced inside the element is greater than a threshold angle $\sin^{-1}(1/n_{sub})$ at the transparent substrate/air interface, it will be totally reflected, resulting in the substrate waveguiding effect. The microstructures 113 in the embodiment converge light beams with incident angles greater than the threshold angle and guide them out of the element. This is why the invention can greatly increase the external quantum efficiency of the organic flat light-emitting device.

Figure 5:
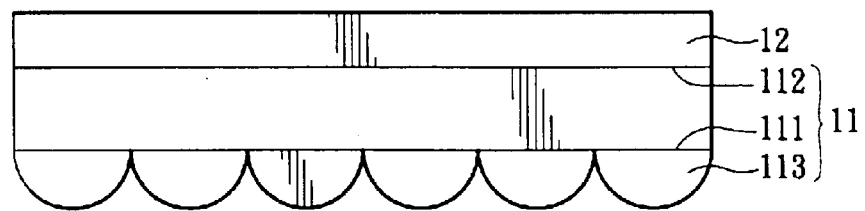
FIG. 5 is a schematic view of step S02 of the invention.

As shown in FIG. 5, step S02 forms a transparent anode on the second surface 112 of the transparent substrate 11. The second surface 112 is an optics-graded smooth plane without any geometric structure. Sputtering or ion plating forms the transparent anode 12. Its material can be a conductive metal oxide such as indium-tin oxide (ITO) or aluminum-zinc oxide (AZO). The thickness of the transparent anode 12 is above 500 Å.

Figure 6:
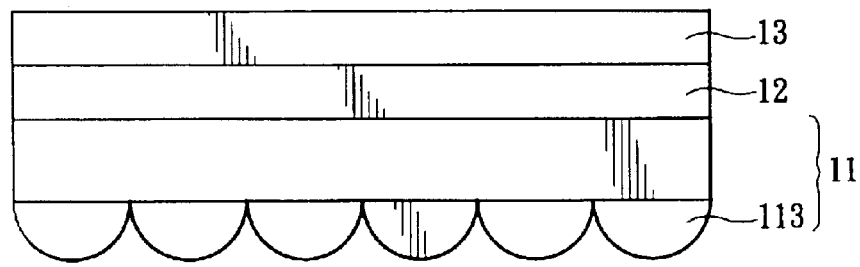
FIG. 6 is a schematic view of step S03 of the invention.

Afterwards, as shown in FIG. 6, the organic electroluminescent layer 13 is formed on the transparent anode 12 by evaporation, spin coating, ink-jet printing or printing in step S03. Its thickness is between 500 Å and 3000 Å. The light emitted by the organic electro-luminescent layer 13 may be blue, green, red, other monochrome or white light. It should be noticed that the organic electro-luminescent layer 13 could be a multi-layer structure.

Figure 7:
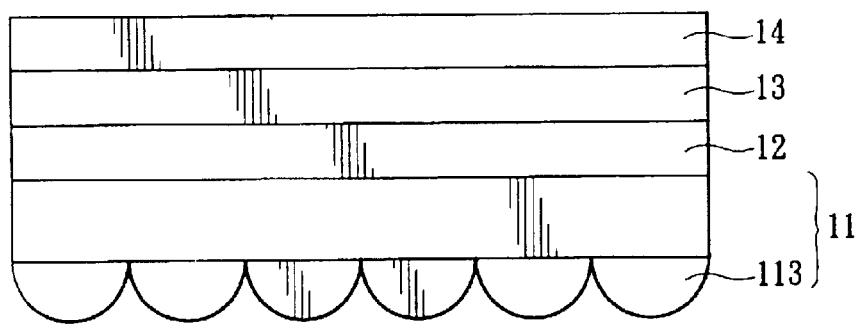
FIG. 7 is a schematic view of step S04 of the invention.

With reference to FIG. 7, the metal cathode 14 in step S04 is formed on the organic electro-luminescent layer 13 by evaporation or sputtering. Its thickness is between 500 Å and 5000 Å. In the current embodiment, the metal cathode 14 is made of aluminum, aluminum/lithium fluoride, calcium, magnesium-silver alloys or silver.

Figure 8:
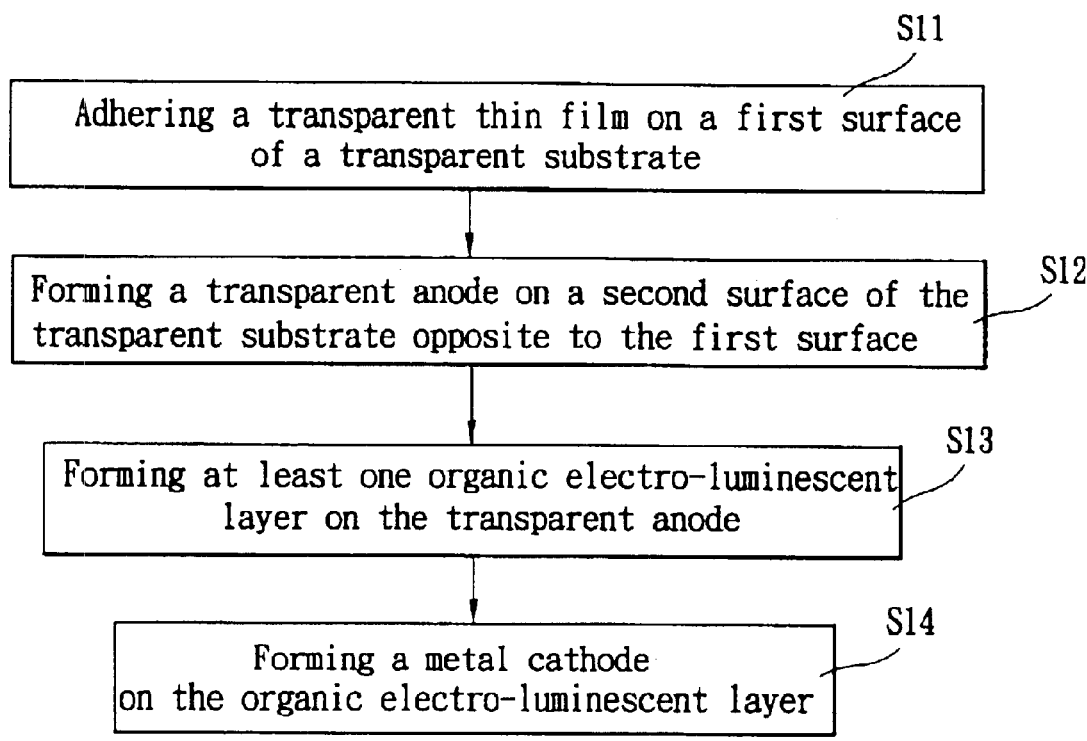
FIG. 8 is a schematic view of another embodiment of the disclosed manufacturing method for organic flat light-emitting devices.

As shown in FIG. 8, in another embodiment of the invention, a manufacturing method for organic flat light-emitting devices of this invention contains the following steps. First, a transparent thin film is adhered on a first surface of a transparent substrate (S11). The transparent thin film has several microstructures with a maximal height of 100 μm. A second surface of the transparent substrate opposite to the first surface is formed with a transparent anode (S12). The transparent anode is formed with at least one organic electro-luminescent layer (S13). Finally, a metal cathode is formed on the organic electro-luminescent layer (S14).

In this case, the transparent substrate may be a plastic substrate, a flexible substrate, or a glass substrate. The plastic substrate and the flexible substrate may be a polycarbonate (PC) substrate, a polyester (PET) substrate, a cyclic olefin copolymer (COC) substrate, or a metallocene-based cyclic olefin copolymer (mCOC). The thickness of the transparent substrate is between 0.2 mm and 5 mm.

Figure 9:
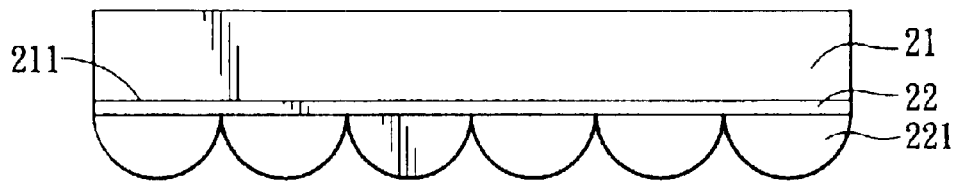
FIG. 9 is a schematic view of step S11 of another embodiment of the invention.

As shown in FIG. 9, the transparent thin film 22 is formed on the first surface 211 of the transparent substrate 21 by an adhesive method. The adhesive method is to use thermal cured glue or UV cured glue to attach the transparent thin film 22 on the transparent substrate 21. The surface of the transparent thin film 22 has several microstructures 221. The height of the microstructures is between 5 μm and 100 μm. In the current embodiment, the features and functions of the microstructures 221 are the same as those in the first embodiment. Other elements in the current embodiment also have the same features and functions as those in the first embodiment.

The disclosed manufacturing method for organic flat light-emitting devices uses simple steps to fabricate organic flat light-emitting devices with microstructures. In the provided embodiments, the function of the microstructures is to efficiently transmit light generated by the organic electro-luminescent layer out of the element, increasing the external efficiency of the organic flat light-emitting device. In comparison with the prior art, the disclosed method can strongly reduce the manufacturing time and lower the cost. The microstructures can effectively reduce the thickness of the device.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A manufacturing method of organic flat light-emitting devices, comprising the steps of:

providing a transparent substrate, which has a first surface and a second surface, the first surface being formed with a plurality of microstructures and each of the microstructures having a curved surface, wherein the curved surface is a protruding surface having a square border;

forming a transparent anode on the second surface of the transparent substrate;

forming at least one organic electro-luminescent layer; and forming a metal cathode on the organic electro-luminescent layer.

2. The manufacturing method of claim 1, wherein the square border has a side length between 10 $\mu$m and 50 $\mu$m.

* * * * *